United States Patent
Wakano (10) Patent No.: US 9,224,778 B2
(45) Date of Patent: Dec. 29, 2015

(54) SOLID-STATE IMAGE SENSOR AND ELECTRONIC DEVICE

(71) Applicant: Sony Corporation, Tokyo (JP)

(72) Inventor: Toshifumi Wakano, Kanagawa (JP)

(73) Assignee: SONY CORPORATION (JP)

( * ) Notice: Subject to any disclaimer, the term of this patent is extended or adjusted under 35 U.S.C. 154(b) by 0 days.

(21) Appl. No.: 14/346,616

(22) PCT Filed: Sep. 27, 2012

(86) PCT No.: PCT/JP2012/074851
§ 371 (c)(1),
(2) Date: Mar. 21, 2014

(87) PCT Pub. No.: WO2013/051451
PCT Pub. Date: Apr. 11, 2013

(65) Prior Publication Data
US 2014/0239433 A1    Aug. 28, 2014

(30) Foreign Application Priority Data
Oct. 7, 2011    (JP) .................................. 2011-223325

(51) Int. Cl.
H01L 31/00    (2006.01)
H01L 27/146    (2006.01)

(52) U.S. Cl.
CPC ...... *H01L 27/14634* (2013.01); *H01L 27/1464* (2013.01); *H01L 27/14607* (2013.01); *H01L 27/14636* (2013.01); *H01L 27/14641* (2013.01)

(58) Field of Classification Search
CPC .................. H01L 27/14634; H01L 27/14636
USPC ........................................ 257/433, 443, 444
See application file for complete search history.

(56) References Cited

U.S. PATENT DOCUMENTS

| | | | |
|---|---|---|---|
| 8,383,447 B2 * | 2/2013 | Yang | 438/65 |
| 2009/0206432 A1 * | 8/2009 | Kim et al. | 257/432 |
| 2010/0201966 A1 * | 8/2010 | Mase et al. | 356/5.01 |
| 2011/0049336 A1 * | 3/2011 | Matsunuma | 250/214.1 |
| 2011/0155893 A1 | 6/2011 | Endo et al. | |
| 2011/0234830 A1 | 9/2011 | Kiyota et al. | |

FOREIGN PATENT DOCUMENTS

| | | |
|---|---|---|
| JP | H11-261044 | 9/1999 |
| JP | 2001-332714 | 11/2001 |
| JP | 2004-296453 | 10/2004 |
| JP | 2005-353994 | 12/2005 |
| JP | 2008-270299 | 11/2008 |
| JP | 2008-300698 | 12/2008 |
| JP | 2011-114324 | 6/2011 |
| JP | 2011-181595 | 9/2011 |

OTHER PUBLICATIONS

Partial European Search Report for European Patent Application No. 12838082.1 dated Sep. 22. 2015, 5 pages.

* cited by examiner

*Primary Examiner* — Hung Vu
(74) *Attorney, Agent, or Firm* — Sheridan Ross P.C.

(57) ABSTRACT

There is provided a solid-state image sensor including a semiconductor substrate in which a plurality of pixels are arranged, and a wiring layer stacked on the semiconductor substrate and formed in such a manner that a plurality of conductor layers having a plurality of wirings are buried in an insulation film. In the wiring layer, wirings connected to the pixels are formed of two conductor layers.

11 Claims, 11 Drawing Sheets

SOLID-STATE IMAGE SENSOR AND ELECTRONIC DEVICE

TECHNICAL FIELD

The present disclosure relates to a solid-state image sensor and an electronic device, and more particularly, to a solid-state image sensor and an electronic device in which reduction of the number of conductor layers in a wiring layer can be more effectively performed.

BACKGROUND ART

Conventionally, a solid-state image sensor such as a CMOS (Complementary Metal Oxide Semiconductor) image sensor or a CCD (Charge Coupled Device) is widely used for a digital still camera, a digital video camera, or the like.

For example, incident light incident on a CMOS image sensor is subjected to photoelectric conversion in a PD (Photodiode) included in a pixel. Also, electric charges generated in the PD are transferred to an FD (Floating Diffusion) via a transfer transistor, converted into a pixel signal having a level corresponding to a light reception amount, and read.

Further, in recent years, a pixel size has been reduced with miniaturization of a solid-state image sensor, and technology for obtaining sufficient characteristics even in a minute pixel has been developed. For example, the applicant of the present application suggests technology capable of suppressing a variation of a saturation signal amount in a back side illumination type CMOS image sensor (see Patent Literature 1).

CITATION LIST

Patent Literature

Patent Literature 1: JP 2011-114324A

SUMMARY OF INVENTION

Technical Problem

Incidentally, in a conventional solid-state image sensor, a plurality of conductor layers (generally, three or more metal layers) are formed in a wiring layer in which wirings connected to pixels are disposed. Usually, it is assumed that an effect of achieving cost reduction can be obtained by reducing the number of conductor layers. However, a layout of wirings is performed under various conditions, including an optical point of view for light incident on the solid-state image sensor and a point of view of a balance with peripheral circuits in which a logic circuit which drives the solid-state image sensor is formed, and effective effects may not be obtained when the number of conductor layers is reduced.

The present disclosure has been made in view of such circumstances, and allows reduction of the number of conductor layers in a wiring layer to be performed more effectively.

Solution to Problem

According to an embodiment of the present disclosure, there is provided a solid-state image sensor including a semiconductor substrate in which a plurality of pixels are arranged, and a wiring layer stacked on the semiconductor substrate and formed in such a manner that a plurality of conductor layers having a plurality of wirings are buried in an insulation film. In the wiring layer, wirings connected to the pixels are formed of two conductor layers.

According to an embodiment of the present disclosure, there is provided an electronic device including a solid-state image sensor, the electric device including a semiconductor substrate in which a plurality of pixels each having a photoelectric conversion element are arranged, and a wiring layer stacked on the semiconductor substrate and formed in such a manner that a plurality of conductor layers having a plurality of wirings are buried in an insulation film. In the wiring layer, wirings connected to the pixels are formed of two conductor layers.

In one aspect of the present disclosure, a semiconductor substrate in which a plurality of pixels are arranged, and a wiring layer formed in such a manner that a plurality of conductor layers having a plurality of wirings disposed therein are buried in an insulation film are stacked. Also, in the wiring layer, wirings connected to the pixels are formed of two conductor layers.

Advantageous Effects of Invention

According to an aspect of the present disclosure, it is possible to perform reduction of the number of conductor layers in the wiring layer more effectively.

DESCRIPTION OF EMBODIMENTS

Hereinafter, concrete embodiments to which the present technology is applied will be described in detail with reference to the drawings.

Figure 1:
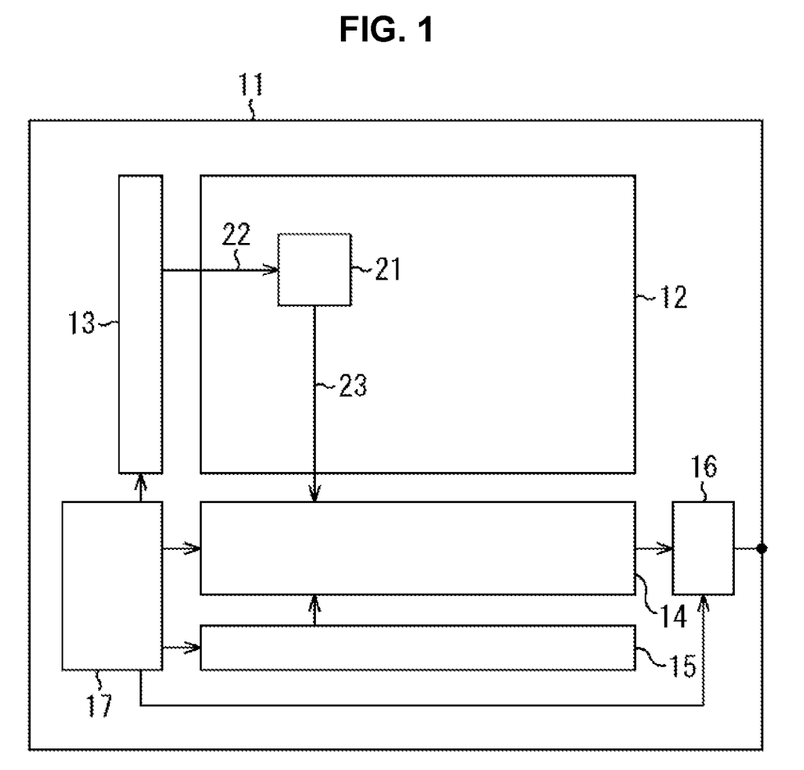
FIG. 1 is a block diagram illustrating a configuration example of an embodiment of an image sensor to which the present invention is applied.

FIG. 1 is a block diagram illustrating a configuration example of an embodiment of an image sensor to which the present invention is applied.

The image sensor 11 is a CMOS type solid-state image sensor, and includes a pixel array unit 12, a vertical driving unit 13, a column processing unit 14, a horizontal driving unit 15, an output unit 16, and a driving control unit 17, as illustrated in FIG. 1.

The pixel array unit 12 includes a plurality of pixels 21 arranged in an array form and is connected to the vertical driving unit 13 through a plurality of horizontal wirings 22 corresponding to the number of rows of the pixels 21 and to the column processing unit 14 through a plurality of vertical wirings 23 corresponding to the number of columns of the pixels 21. In other words, each of the plurality of pixels 21 included in the pixel array unit 12 is arranged at a point at which the horizontal wiring 22 and the vertical wiring 23 intersect.

The vertical driving unit 13 sequentially supplies a driving signal (a transfer signal, a selection signal, a reset signal or the like) for driving each pixel 21 to each of the rows of the plurality of pixels 21 included in the pixel array unit 12 through the horizontal wiring 22.

The column processing unit 14 performs a CDS (Correlated Double Sampling) process on a pixel signal output through the vertical wiring 23 from each pixel 21 to extract a signal level of the pixel signal and acquire pixel data corresponding to a light reception amount of the pixel 21.

The horizontal driving unit 15 sequentially supplies a driving signal for causing the pixel data acquired from each pixel 21 to be sequentially output from the column processing unit 14, to the column processing unit 14 for each of the columns of the plurality of pixels 21 included in the pixel array unit 12.

The pixel data is supplied from the column processing unit 14 to the output unit 16 at a timing according to the driving signal of the horizontal driving unit 15, and the output unit 16 amplifies, for example, the pixel data and outputs the resultant pixel data to an image processing circuit of a subsequent stage.

The driving control unit 17 controls driving of each block in the image sensor 11. For example, the driving control unit 17 generates a clock signal according to a driving period of each block and supplies the clock signal to each block.

Figure 2:
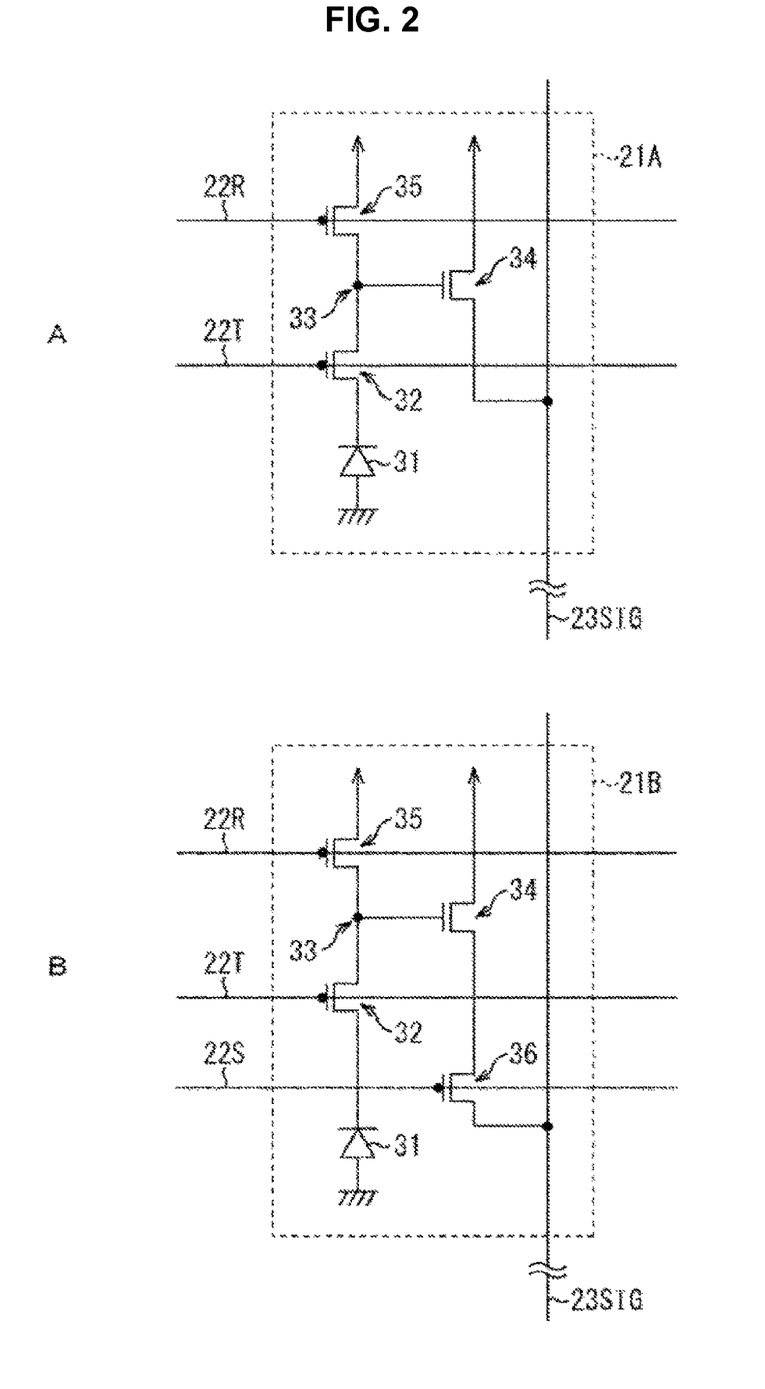
FIG. 2 is a circuit diagram illustrating a configuration example of a pixel.

FIG. 2 is a circuit diagram of the pixel 21. A configuration example of a pixel 21A including three transistors (a so-called 3-transistor type) is illustrated in A of FIG. 2, and a configuration example of a pixel 21B including four transistors (a so-called 4-transistor type) is illustrated in B of FIG. 2.

The pixel 21A includes a PD 31, a transfer transistor 32, an FD 33, an amplification transistor 34 and a reset transistor 35, as illustrated in A of FIG. 2. Further, a transfer signal line 22T constituting the horizontal wiring 22 is connected to a gate of the transfer transistor 32, and a reset signal line 22R constituting the horizontal wiring 22 is connected to a gate of the reset transistor 35. Further, an output signal line 23SIG constituting the vertical wiring 23 is connected to a source of the amplification transistor 34, and a predetermined power supply voltage is supplied to drains of the reset transistor 35 and the amplification transistor 34.

Also, in the pixel 21A, electric charges generated through photoelectric conversion in the PD 31 are transferred from the PD 31 to the FD 33 if the transfer transistor 32 is turned on according to a transfer signal supplied through the transfer signal line 22T. Also, the electric charges accumulated in the FD 33 are output as a pixel signal corresponding to a level thereof by the amplification transistor 34 through the output signal line 23SIG. Further, when the reset transistor 35 is turned on according to a reset signal supplied through the reset signal line 22R, the electric charges accumulated in the FD 33 are reset. Further, in the pixel 21A, distinction of selection and non-selection is performed by an electric potential of the FD 33.

Further, the pixel 21B includes a PD 31, a transfer transistor 32, an FD 33, an amplification transistor 34, a reset transistor 35, and a selection transistor 36, as illustrated in B of FIG. 2.

The pixel 21B has a configuration different from the pixel 21A in that the amplification transistor 34 is connected to an output signal line 23SIG through the selection transistor 36, and selection and non-selection of the pixel 21B are performed by the selection transistor 36. In other words, if the selection transistor 36 is turned on according to a selection signal supplied through a selection signal line 22S connected to a gate of the selection transistor 36, the amplification transistor 34 and the output signal line 23SIG are connected to each other.

In the pixel 21A and the pixel 21B configured in this way, a predetermined power supply voltage is supplied to the drains of the amplification transistor 34 and the reset transistor 35 in both configurations. This power supply voltage may be common or not common to the plurality of pixels 21 arranged in the pixel array unit 12 or, as the power supply voltage, a fixed (constant) voltage may be supplied or a voltage may be supplied through pulse driving.

Incidentally, in recent years, miniaturization of the pixel 21 is underway with downsizing of the image sensor 11, and a structure in which a transistor (driving element) is shared by a plurality of PDs 31 is proposed for the purpose of improvement of an aperture rate of the PDs 31. In such a pixel share structure, for example, pixels are arranged in an array form in the pixel array unit 12 in a share unit (2-pixel share unit) in which transistors are shared by two PDs 31. Further, for example, a share unit in which transistors are shared by four PDs 31 (4-pixel share unit), a share unit in which transistors are shared in eight PDs 31 (8-pixel share unit) or a share unit in which transistors are shared by other numbers of PDs 31 may be adopted.

A pixel share structure will be described with reference to FIG. 3.

Figure 3:
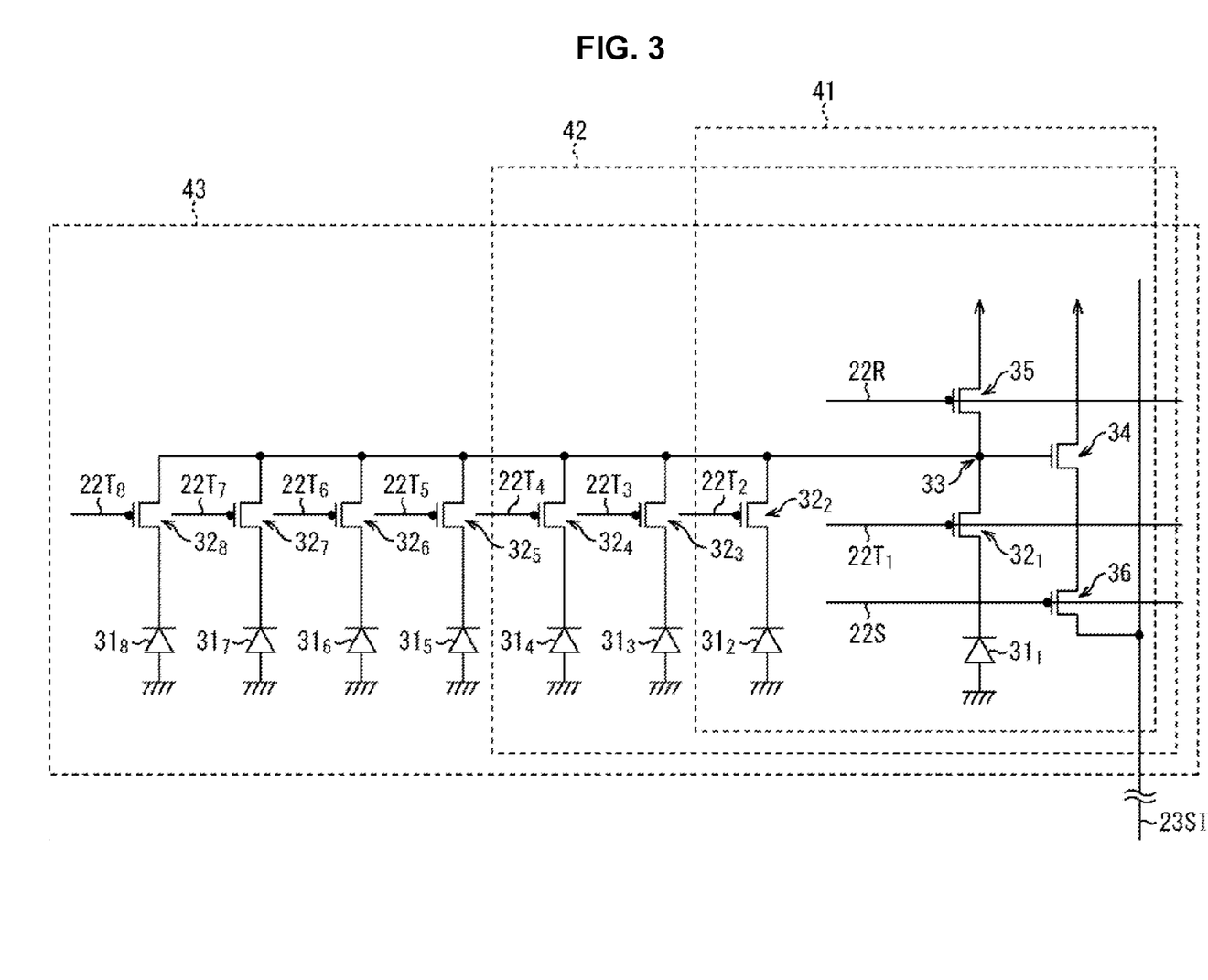
FIG. 3 is a diagram illustrating a pixel share structure.

In FIG. 3, configuration examples of a 2-pixel share unit 41, a 4-pixel share unit 42 and an 8-pixel share unit 43 are shown in areas surrounded by respective dotted lines.

For example, the 2-pixel share unit 41 includes two PDs $31_1$ and $31_2$, two transfer transistors $32_1$ and $32_2$, an FD 33, an amplification transistor 34, a reset transistor 35, and a selection transistor 36. In other words, in this structure, the two PDs $31_1$ and $31_2$ share the amplification transistor 34, the reset transistor 35 and the selection transistor 36. Further, a configuration in which the selection transistor 36 is not included as described with reference to A of FIG. 2 (3-transistor type) may be adopted.

In the 2-pixel share unit 41, the PD $31_1$ is connected to the FD 33 through the transfer transistor $32_1$, and the PD $31_2$ is connected to the FD 33 through the transfer transistor $32_2$. Also, the transfer transistors $32_1$ and $32_2$ are turned on at different timings according to transfer signals supplied through the transfer signal lines $22T_1$ and $22T_2$, respectively, and driven so that electric charges are transferred from the PDs $31_1$ and $31_2$ to the FD 33.

The 4-pixel share unit 42 has a structure in which four PDs $31_1$ to $31_4$ share the amplification transistor 34, the reset transistor 35 and the selection transistor 36, similar to the 2-pixel share unit 41. Also, in the 4-pixel share unit 42, the transfer transistors $32_1$ to $32_4$ are turned on at different timings according to transfer signals supplied through the transfer signal lines $22T_1$ to $22T_4$ and driven so that electric charges are transferred from the PD $31_1$ to $31_4$ to the FD 33.

The 8-pixel share unit 43 has a structure in which eight PDs $31_1$ to $31_8$ share the amplification transistor 34, the reset transistor 35 and the selection transistor 36, similar to the 2-pixel share unit 41. Also, in the 8-pixel share unit 43, the transfer transistors $32_1$ to $32_8$ are turned on at different timings according to transfer signals supplied through the transfer signal lines $22T_1$ to $22T_8$ and driven so that electric charges are transferred from the PDs $31_1$ to $31_8$ to the FD 33.

Figure 4:
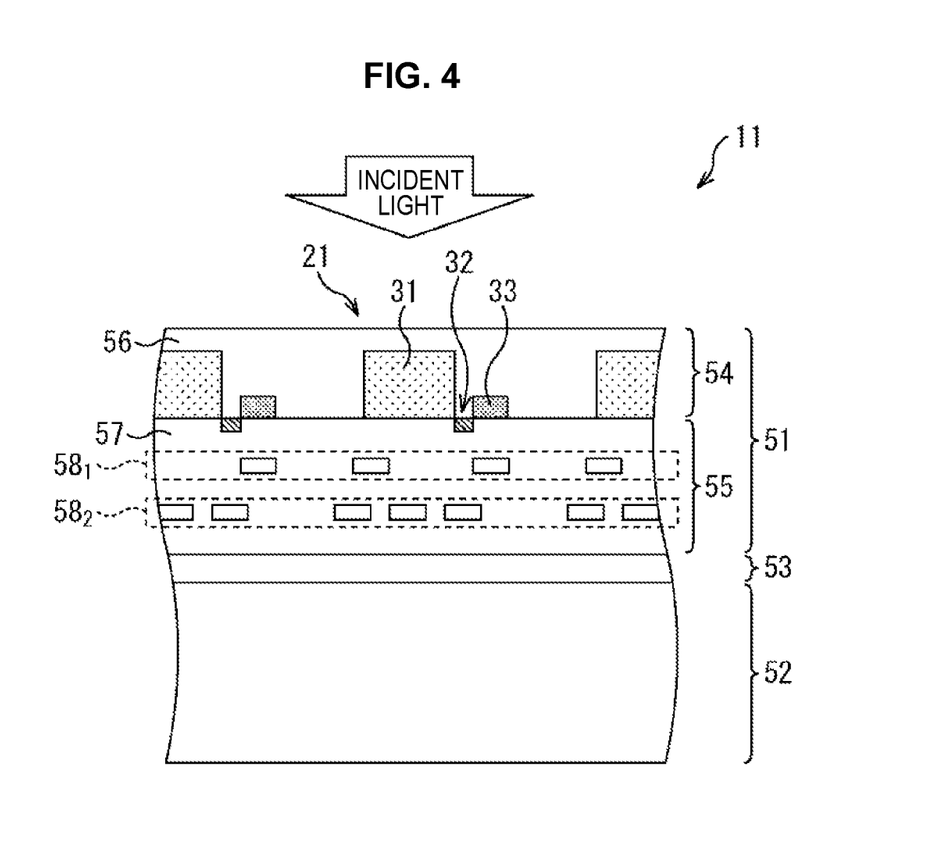
FIG. 4 is a view illustrating a cross-sectional configuration example near a pixel of an image sensor.

Next, FIG. 4 is a view illustrating an example of a cross-sectional configuration near the pixel 21 of the image sensor 11.

The image sensor 11 has a configuration in which a sensor chip 51 and a signal processing chip 52 are adhered by an adhesive layer 53, as illustrated in FIG. 4.

The sensor chip 51 has a configuration in which a semiconductor substrate 54 and a wiring layer 55 are stacked, and the pixel array unit 12 of FIG. 1 is formed in the sensor chip 51. Further, a solid-state image sensor 21 is a so-called back side illumination type CMOS image sensor in which the semiconductor substrate 54 of the sensor chip 51, i.e., a back side (a surface directed to an upper side of FIG. 4) directed to a side opposite to a surface of the semiconductor substrate 54 on which the wiring layer 55 is provided is irradiated with incident light.

Logic circuits for driving each pixel 21 of the pixel array unit 12, i.e., the vertical driving unit 13, the column processing unit 14, the horizontal driving unit 15, the output unit 16 and the driving control unit 17 of FIG. 1 are formed in the signal processing chip 52.

In the semiconductor substrate 54, for example, the PD 31 and the FD 33 formed of an N-type impurity region inside a P-type silicon layer (P well) 56 are formed in each pixel 21. Further, a gate electrode (a transfer gate electrode 61 of FIG. 5) of the transfer transistor 32 is formed in a position between the PD 31 and the FD 33 in the surface of the semiconductor substrate 54. The semiconductor substrate 54 is a light receiving layer which receives incident light with which the image sensor 11 is irradiated, and electric charges generated by the PD 31 receiving the incident light and performing photoelectric conversion are transferred to the FD 33 through the transfer transistor 32.

The wiring layer 55 has a configuration in which a plurality of layers (metal layers) formed of conductors forming the horizontal wirings 22 and the vertical wirings 23 of FIG. 1 are buried in an interlayer insulation film 57. For example, the wiring layer 55 has a 2-layer structure including a first metal layer $58_1$ and a second metal layer $58_2$ in the configuration example of FIG. 2. For example, the vertical wiring 23 is formed in the first metal layer $58_1$ which is on a side near the semiconductor substrate 54, and the horizontal wiring 22 is formed in the second metal layer $58_2$ that is on a side away from the semiconductor substrate 54.

Here, in the image sensor 11, the layout of the horizontal wirings 22 and the vertical wirings 23 formed in the wiring layer 55 can be designed without considering the incident light incident on the PD 31 by adopting a back side illumination type structure. In other words, for example, in a surface irradiation type CMOS image sensor, there is a demerit in that a layout of wirings formed in a wiring layer adversely affects a light reception amount of a PD since the CMOS image sensor has a configuration in which the PD is irradiated with incident light penetrating the wiring layer. On the other hand, in the image sensor 11, since the layout of the horizontal wirings 22 and the vertical wirings 23 can be designed without receiving such adverse effects, a degree of freedom of the layout is improved.

Further, the image sensor 11 adopts a stack structure in which the sensor chip 51 and the signal processing chip 52 are stacked, such that the number of metal layers 58 formed in the wiring layer 55 can be designed without considering the number of metal layers in the signal processing chip 52. In other words, for example, in a configuration in which a logic circuit is arranged around the sensor chip 51, it is necessary to perform a design in consideration of both the metal layer 58 formed in the wiring layer 55 of the sensor chip 51 and the metal layer formed in the logic circuit. Therefore, for example, when the number of metal layers is reduced, an area of the logic circuit increases and, as a result, there is a demerit in that a cost increases.

On the other hand, in the image sensor 11, since the number of metal layers 58 formed in the wiring layer 55 can be determined without considering the number of metal layers in the signal processing chip 52, a degree of freedom of a design for the metal layers 58 formed in the wiring layer 55 is improved.

Thus, in the wiring layer 55, since the degree of freedom is improved for a design in the image sensor 11, the occurrence of the demerit described above can be prevented even when the 2-layer structure including the first metal layer $58_1$ and the second metal layer $58_2$ in the wiring layer 55 is adopted. In other words, even when a wiring density is improved in a range allowed by a design rule of wirings, the metal layers 58 do not adversely affect the light reception amount of the PD 31. Further, even when the number of metal layers 58 is reduced, the area of the signal processing chip 52 does not increase.

Therefore, in the image sensor 11, since the number of manufacturing processes can be reduced by reducing the number of metal layers 58 and reduction of a manufacturing cost can be achieved, it is possible to more effectively perform reduction of the number of metal layers 58 compared to a conventional image sensor.

Next, a first configuration example of the layout of the horizontal wirings 22 and the vertical wirings 23 in the image sensor 11 will be described with reference to FIG. 5.

The image sensor 11A has a structure in which an 8-pixel share unit 44 is arranged in an array form, and eight PDs $31_1$ to $31_8$ in the 8-pixel share unit 44 share an amplification transistor 34, a reset transistor 35 and a selection transistor 36. Further, the 8-pixel share unit 44 includes transfer gate electrodes $61_1$ to $61_8$ constituting the transfer transistors $32_1$ to $32_8$, an amplification gate electrode 62 constituting the amplification transistor 34, a selection gate electrode 63 constituting the selection transistor 36, and a reset gate electrode 64 constituting the reset transistor 35, as illustrated in FIG. 5.

Further, the 8-pixel share unit 44 is configured in such a manner that the four PDs $31_1$ to $31_4$ arranged in such a manner that vertical×horizontal is 2×2 share the FD $33_1$, and the four PDs $31_5$ to $31_8$ arranged in such a manner that vertical× horizontal is 2×2 share the FD $33_2$. In other words, the 8-pixel share unit 44 has a configuration in which the four PDs 31 arranged 2×2 which share the FD 33 form one set and two sets are continuously arranged in a vertical direction (2×2×n (n: 2)).

In the image sensor 11A, a power supply line 23VDD for supplying power necessary for driving of the 8-pixel share unit 44, and an output signal line 23SIG for outputting a pixel signal obtained by the 8-pixel share unit 44 are disposed in parallel. Here, the power supply line 23VDD and the output signal line 23SIG are vertical wirings 23 arranged to extend in a vertical direction (a direction directed to the column processing unit 14) of the image sensor 11, as illustrated in FIG. 1.

Further, in the image sensor 11A, transfer signal lines $22T_1$ to $22T_8$ which supply a driving signal to the transfer gate electrodes $61_1$ to $61_8$, a selection signal line 22S which supplies a driving signal to the selection gate electrode 63, and a reset signal lines 22R which supplies a driving signal to the reset gate electrode 64 are disposed in parallel. Further, illustration of the transfer signal lines $22T_1$ to $22T_4$ is omitted in FIG. 5, but the transfer signal lines $22T_1$ to $22T_4$ are disposed to pass through a region overlapping the transfer gate electrodes $61_1$ to $61_4$, similar to the transfer signal lines $22T_5$ to $22T_8$. Here, the transfer signal lines $22T_1$ to $22T_8$, the selection signal line 22S and the reset signal line 22R are horizontal wirings 22 arranged to extend in a horizontal direction of the image sensor 11, as illustrated in FIG. 1.

For example, the power supply line 23VDD and the output signal line 23SIG are formed in the first metal layer $58_1$ of FIG. 4, and the transfer signal lines $22T_1$ to $22T_8$, the selection signal line 22S and the reset signal line 22R are formed in the second metal layer $58_2$. In other words, in the image sensor 11A, the wirings connected to the pixel 21 in the wiring layer 55 are formed of two layers of the first metal layer $58_1$ in which the vertical wirings 23 are disposed and the second metal layer $58_2$ in which the horizontal wirings 22 are disposed.

Figure 5:
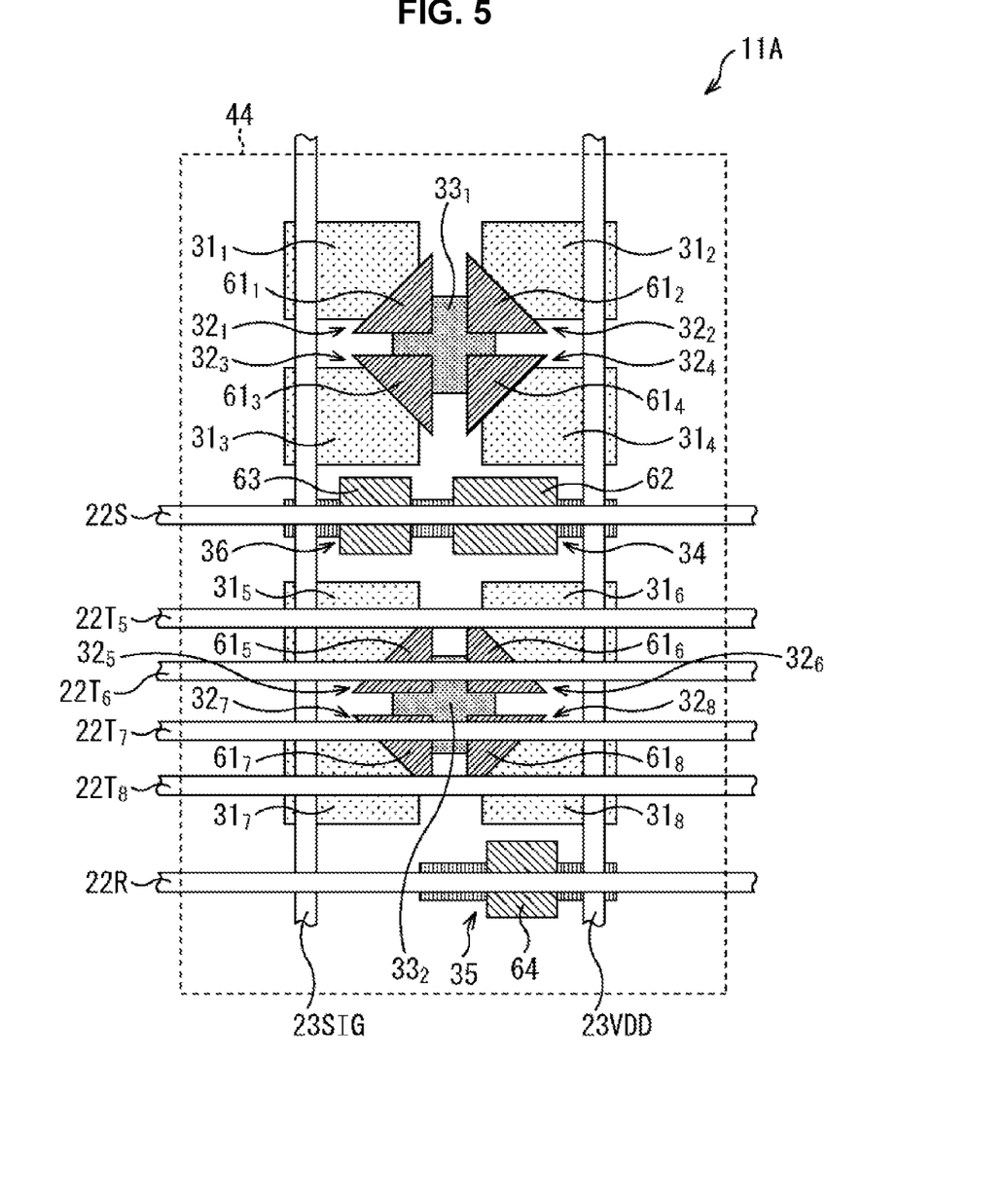
FIG. 5 is a view illustrating a first configuration example of a layout of horizontal wirings and vertical wirings.

Further, the power supply line 23VDD is illustrated as one wiring in FIG. 5, but the power supply line 23VDD may include a plurality of wirings according to a wiring layout. Further, it is preferable for the power supply line 23VDD to be laid out so that its wiring width is great in a range allowed by a design rule of wirings. Accordingly, it is possible to reduce voltage drop (so-called IR drop) of a product of current and resistance with the increase of consumption power.

Thus, in the image sensor 11A, the wiring layer 55 can have a 2-layer structure by disposing the power supply line 23VDD and the output signal line 23SIG, and the transfer signal lines $22T_1$ to $22T_8$, the selection signal line 22S and the reset signal line 22R in the different metal layers 58. Further, it is possible to suppress degradation of characteristics due to capacitance between the wiring and the sensor chip 51 by forming the transfer signal lines $22T_1$ to $22T_8$, the selection signal line 22S and the reset signal line 22R in the second metal layer $58_2$ which is on a side farther than the first metal layer $58_1$ with respect to the sensor chip 51.

Further, when a back side illumination type CMOS image sensor is adopted as the image sensor 11A, it is possible to obtain capacitance uniformity by adopting the layout of wirings disclosed in Patent Literature 1 filed by the applicant of the present application. Accordingly, it is possible to suppress variation of a saturation signal amount and obtain better characteristics.

Next, a variant of the first configuration example of the layout of the horizontal wirings 22 and the vertical wirings 23 will be described with reference to FIG. 6.

Figure 6:
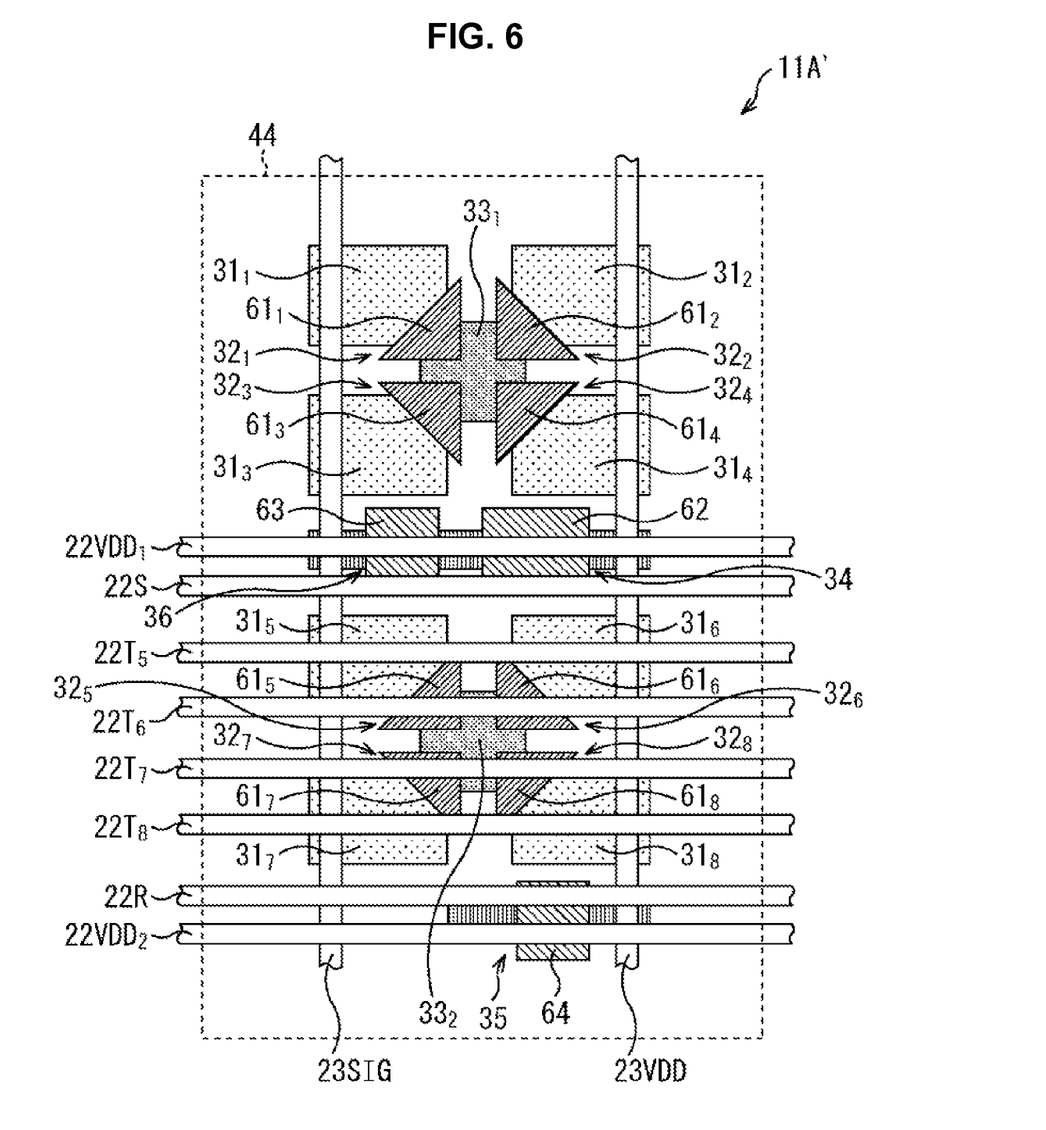
FIG. 6 is a view illustrating a variant of the first configuration example of a layout of horizontal wirings and vertical wirings.

As illustrated in FIG. 6, an image sensor 11A' includes an 8-pixel share unit 44 in which eight PDs $31_1$ to $31_8$ share an amplification transistor 34, a reset transistor 35 and a selection transistor 36, similar to the image sensor 11A of FIG. 5. Further, in the image sensor 11A', a power supply line 23VDD and an output signal line 23SIG are disposed, similar to the image sensor 11A.

Also, the image sensor 11A' is different from the image sensor 11A in that power supply lines $22VDD_1$ and $22VDD_2$ are disposed in parallel to transfer signal lines $22T_1$ to $22T_8$, a selection signal line 22S and a reset signal line 22R to extend in a horizontal direction. Further, in the image sensor 11A', the power supply line 23VDD, and the power supply lines $22VDD_1$ and $22VDD_2$ are connected in an overlapping place by a contact region (not illustrated).

In other words, in the image sensor 11A', all power necessary for driving of the 8-pixel share unit 44 is supplied by the power supply line 23VDD and the power supply lines $22VDD_1$ and $22VDD_2$, such that power supply can be strengthened. In other words, in the image sensor 11A', the power supply line 23VDD is a main current path and the power supply lines $22VDD_1$ and $22VDD_2$ are subsidiary current paths, such that influence of the IR drop can be reduced.

Further, the image sensor 11A' can have, for example, a 2-layer structure in which the power supply line 23VDD and the output signal line 23SIG are formed in the first metal layer $58_1$, and the transfer signal lines $22T_1$ to $22T_8$, the selection signal line 22S, the reset signal line 22R and the power supply lines $22VDD_1$ and $22VDD_2$ are formed in the second metal layer $58_2$.

Further, even in the image sensor 11A', better characteristics can be obtained by adopting the layout of wirings disclosed in Patent Literature 1 filed by the applicant of the present application, similar to the image sensor 11A.

Next, a second configuration example of the layout of the horizontal wirings 22 and the vertical wirings 23 in the image sensor 11 will be described with reference to FIG. 7.

An image sensor 11B has a structure in which a 4-pixel share unit 45 is arranged in an array form, and four PDs $31_1$ to $31_4$ in the 4-pixel share unit 45 share an amplification transistor 34, a reset transistor 35 and a selection transistor 36. In other words, the image sensor 11A of FIG. 5 has the configuration in which the eight eight PDs $31_1$ to $31_8$ share the transistors whereas the image sensor 11B has a configuration in which the four PDs $31_1$ to $31_4$ share the transistors.

Further, in the 4-pixel share unit 45, the four PDs $31_1$ to $31_4$ are arranged in such a manner that vertical×horizontal is 2×2 (2×2×n (n:1)). Also, the 4-pixel share unit 45 is configured so that two PDs $31_1$ and $31_2$ arranged in a horizontal direction share the FD $33_1$, and the two PDs $31_3$ and $31_4$ arranged in a horizontal direction share the FD $33_2$.

Further, the 4-pixel share unit 45 includes transfer gate electrodes $61_1'$ to $61_4'$ constituting the transfer transistors $32_1$ to $32_4$, an amplification gate electrode 62 constituting the amplification transistor 34, a selection gate electrode 63 constituting the selection transistor 36, and a reset gate electrode 64 constituting the reset transistor 35.

Further, in the 4-pixel share unit 45, the reset transistor 35 is arranged side by side with the amplification transistor 34 and the selection transistor 36, unlike the 8-pixel share unit 44 in FIG. 5. In other words, in the 8-pixel share unit 44, the reset transistor 35 is arranged below the PDs $31_1$ to $31_8$ whereas in the 4-pixel share unit 45, the reset transistor 35 is arranged between the PDs $31_1$ and $31_2$ and the PDs $31_3$ and $31_4$. Accordingly, in the image sensor 11B, the reset signal line 22R is disposed adjacent to the selection signal line 22S.

Here, in the image sensor 11B, the 4-pixel share units 45 adjacent in a vertical direction share the transfer gate electrodes $61_1'$ to $61_4'$. In other words, the transfer gate electrode $61_1'$ is shared by the transfer transistor $32_1$ of the 4-pixel share unit 45 and the transfer transistor $32_3$ of the 4-pixel share unit $45_{-1}$ arranged above the 4-pixel share unit 45. Further, the transfer gate electrode $61_2'$ is shared by the transfer transistor $32_2$ of the 4-pixel share unit 45 and the transfer transistor $32_4$ of the 4-pixel share unit $45_{-1}$ arranged above the 4-pixel share unit 45. Similarly, the transfer gate electrodes $61_3'$ and $61_4'$ are shared by the transfer transistors $32_3$ and $32_4$ of the 4-pixel share unit 45 and the transfer transistors $32_1$ and $32_2$ of the 4-pixel share unit $45_{+1}$ arranged below the 4-pixel share unit 45.

Further, in the image sensor 11B, a power supply line 23VDD for supplying power necessary for driving of the 4-pixel share unit 45 and an output signal line 23SIG for outputting a pixel signal obtained by the 4-pixel share unit 45 are disposed in parallel to extend in the vertical direction. Further, transfer signal lines $22T_1$ to $22T_4$ which supply a driving signal to the transfer gate electrodes $61_1$ to $61_4$, a selection signal line 22S which supplies a driving signal to the selection gate electrode 63, and a reset signal line 22R which supplies a driving signal to the reset gate electrode 64 are disposed in parallel to extend in a horizontal direction.

Also, in the image sensor 11B, the power supply line 23VDD and the output signal line 23SIG may be formed in the first metal layer $58_1$, and the transfer signal lines $22T_1$ to $22T_4$, the selection signal line 22S and the reset signal line 22R may be formed in the second metal layer $58_2$, similar to the image sensor 11A of FIG. 5. Further, the transfer signal lines $22T_1$ and $22T_2$ are shared with the 4-pixel share unit $45_4$ adjacent above the 4-pixel share unit 45, and the transfer signal lines $22T_3$ and $22T_4$ are shared with the 4-pixel share unit $45_{+1}$ adjacent below the 4-pixel share unit 45.

Thus, the 2-layer structure of the first metal layer $58_1$ and the second metal layer $58_2$ can be adopted in the wiring layer 55 even in the image sensor 11B, such that the number of metal layers 58 can more effectively reduced.

Next, a variant of the second configuration example of the layout of the horizontal wirings 22 and the vertical wirings 23 will be described with reference to FIG. 8.

Figure 7:
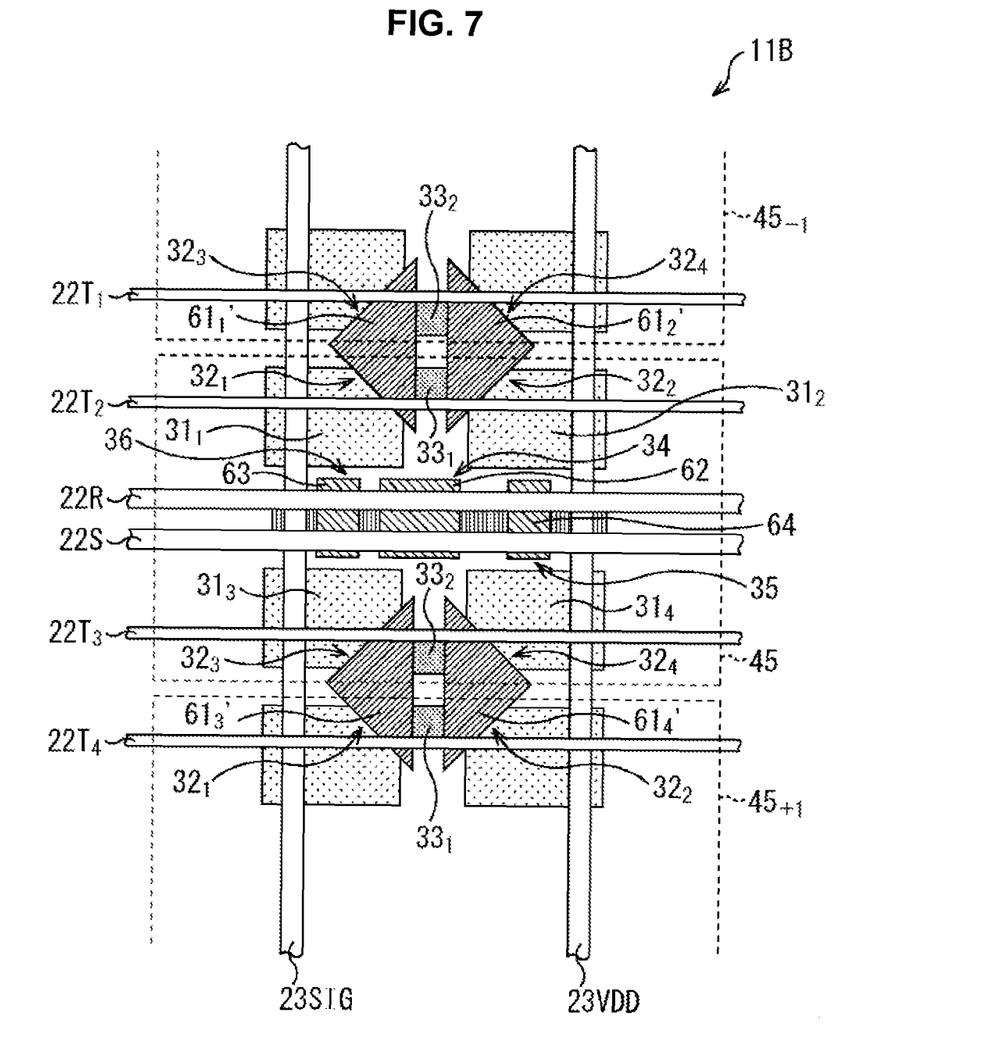
FIG. 7 is a view illustrating a second configuration example of a layout of horizontal wirings and vertical wirings.
Figure 8:
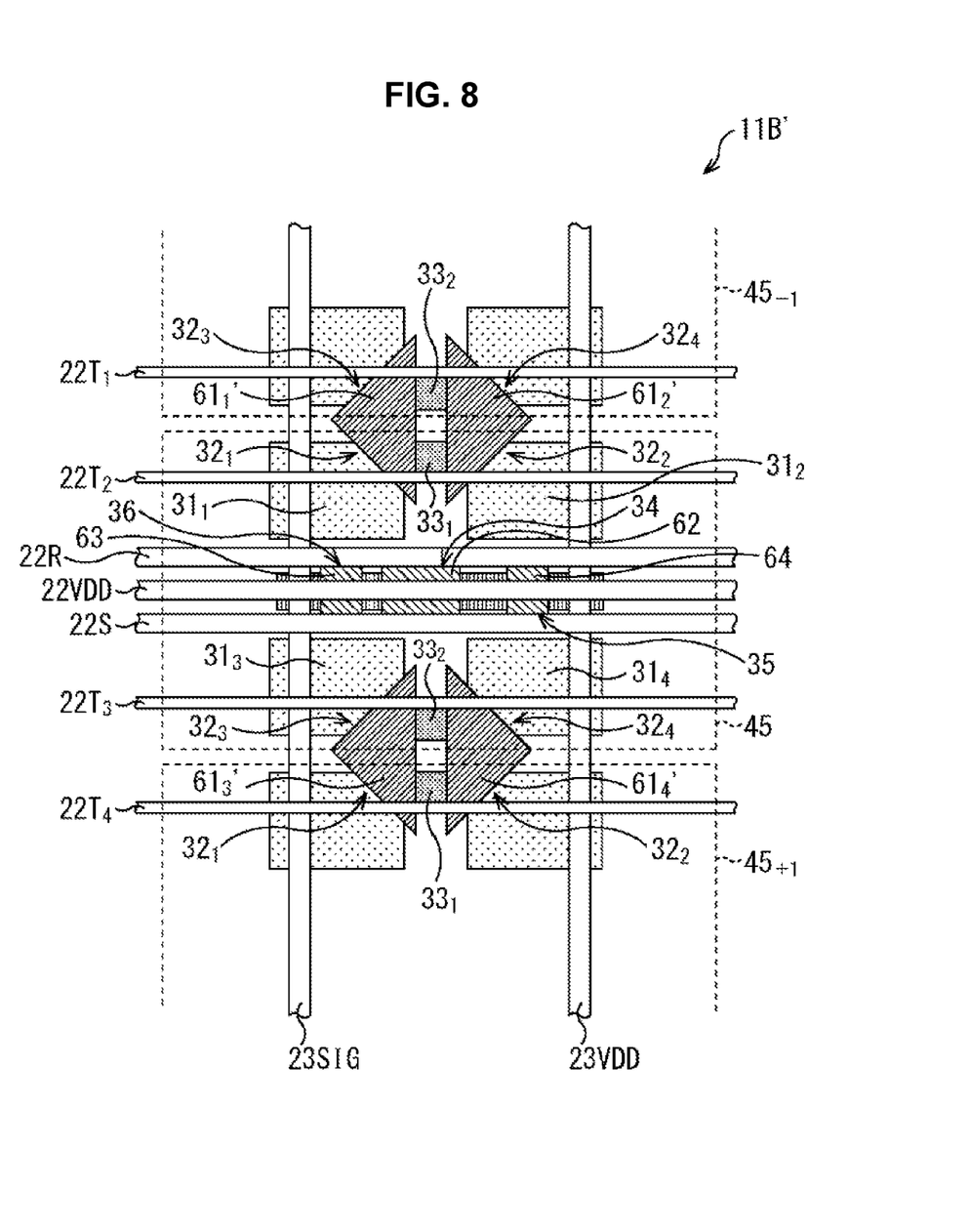
FIG. 8 is a view illustrating a variant of the second configuration example of a layout of horizontal wirings and vertical wirings.

As illustrated in FIG. 8, an image sensor 11B' has a structure in which four PDs $31_1$ to $31_4$ share an amplification transistor 34, a reset transistor 35 and a selection transistor 36, similar to the image sensor 11B of FIG. 7, and an arrangement thereof is similar to the image sensor 11B.

Also, in the image sensor 11B', a power supply line 22VDD is disposed as a subsidiary current path, similar to the image sensor 11A' of FIG. 6. In other words, even in the image sensor 11B', the power supply line 23VDD can be a main current path and the power supply line 22VDD can be a subsidiary current path, such that an influence of the IR drop can be reduced.

Next, a third configuration example of the layout of the horizontal wirings 22 and the vertical wirings 23 in the image sensor 11 will be described with reference to FIG. 9.

Figure 9:
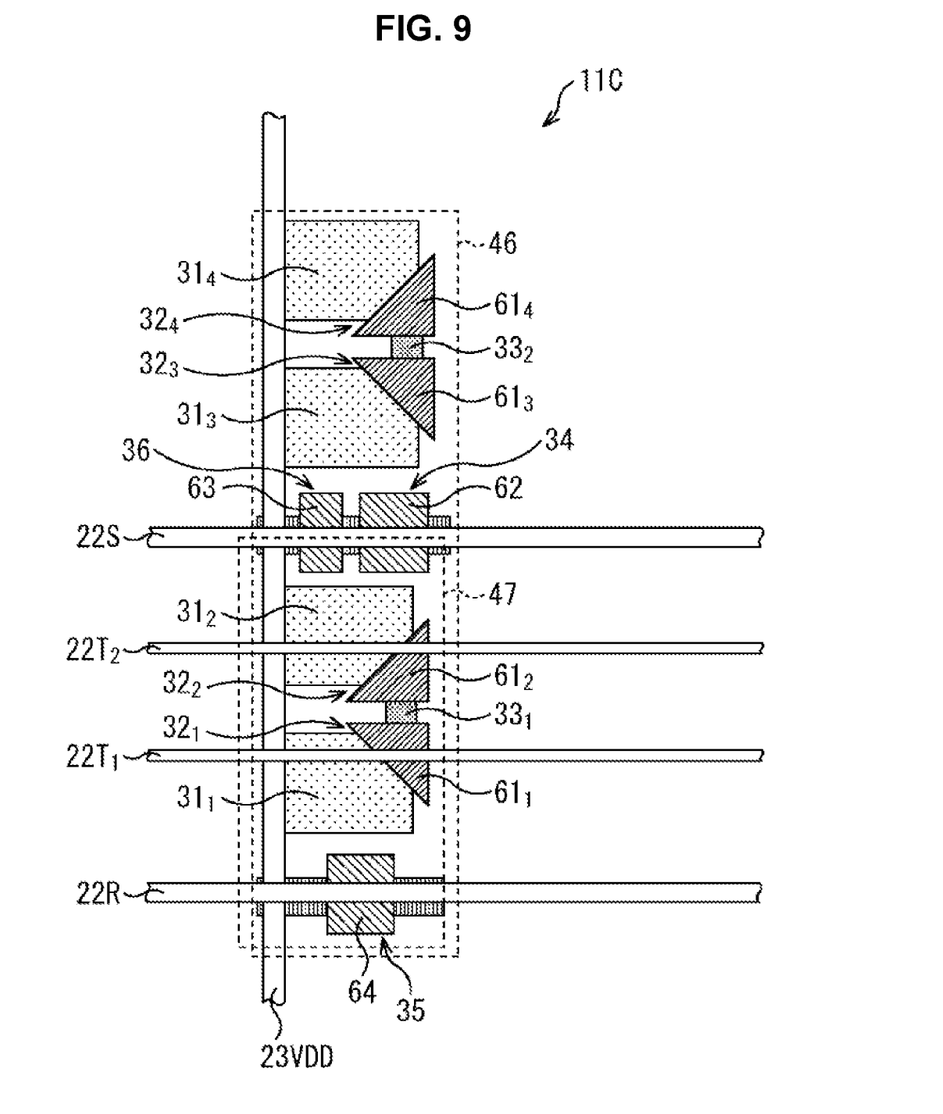
FIG. 9 is a view illustrating a third configuration example of a layout of horizontal wirings and vertical wirings.

In an image sensor 11C, a configuration having a 4-pixel share unit 46 in which four PDs 31 arranged in a vertical direction share transistors or a configuration having a 2-pixel share unit 47 in which two PDs 31 arranged in a vertical direction share transistors is adopted, as illustrated in FIG. 9.

The 4-pixel share unit 46 has a structure in which four PDs $31_1$ to $31_4$ arranged in such a manner that vertical×horizontal is 1×4 share an amplification transistor 34, a reset transistor 35 and a selection transistor 36.

On the other hand, the 2-pixel share unit 47 has a structure in which two PDs $31_1$ and $31_2$ arranged in such a manner that vertical×horizontal is 1×2 share the amplification transistor 34, the reset transistor 35 and the selection transistor 36.

Further, in FIG. 9, a layout when the 4-pixel share unit 46 is adopted is illustrated as an arrangement of the amplification transistor 34, the selection transistor 36 and the reset transistor 35. Further, in FIG. 9, illustration of the output signal line 23 SIG is omitted, but the output signal line 23 SIG, for example, is formed in any position in parallel to the power supply line 23VDD in the same metal layer 58 of the power supply line 23VDD, as in FIG. 5. Further, illustration of the transfer signal lines $22T_3$ and $22T_4$ is also omitted.

Even in the image sensor 11C adopting the 4-pixel share unit 46 or the 2-pixel share unit 47 configured in this way, a 2-layer structure in which the power supply line 23VDD and the output signal line 23SIG, and the transfer signal lines $22T_1$ to $22T_4$, the selection signal line 22S and the reset signal line 22R are formed in the different metal layers 58 can be adopted. Accordingly, it is possible to more effectively reduce a number of metal layers 58.

Next, a variant of the third configuration example of the layout of the horizontal wirings 22 and the vertical wirings 23 will be described with reference to FIG. 10.

Figure 10:
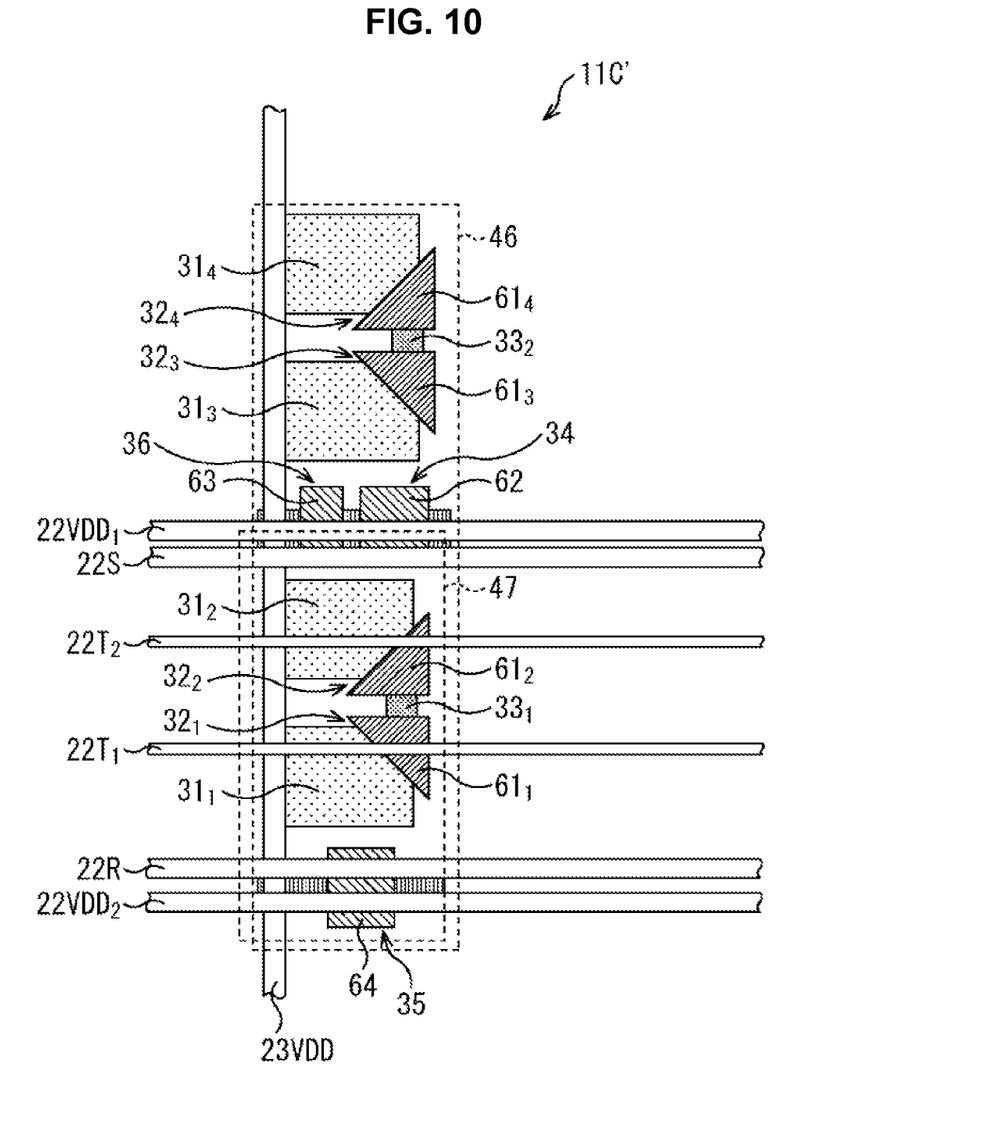
FIG. 10 is a view illustrating a variant of the third configuration example of a layout of horizontal wirings and vertical wirings.

As illustrated in FIG. 10, an image sensor 11C' has a structure in which a 4-pixel share unit 46 or a 2-pixel share unit 47 is adopted, similar to the image sensor 11C of FIG. 9.

Also, in the image sensor 11C', power supply lines $22VDD_1$ and $22VDD_2$ are disposed, similar to the image sensor 11A' of FIG. 6. In other words, even in the image sensor 11C', the power supply line 23VDD can be a main current path and the power supply lines $22VDD_1$ and $22VDD_2$ can be subsidiary current paths. Accordingly, it is possible to reduce an influence of the IR drop.

Further, in the configuration example described above, while the 8-pixel share, 4-pixel share and 2-pixel share have been described, other share structures may be adopted, and a configuration in which the pixels 21 each having one PD 31 are arranged in an array form in the pixel array unit 12 may be adopted. Further, the number and the layout of the power supply line 23VDD, output signal line 23SIG, transfer signal line 22T, selection signal line 22S and reset signal line 22R are not limited to the above-described configuration example and may be arbitrarily designed in a range according to a design rule of wirings.

Further, as the metal layer 58 formed in the wiring layer 55, the metal layer 58 having a function as a wiring may have a 2-layer structure or, for example, a 3 or more layer configuration in which a metal layer (so-called dummy wiring) not connected to the outside without having a function as a wiring is formed. For example, a dummy wiring may be disposed for the purpose of adjusting a capacitance between wirings or blocking unnecessary light.

Further, in the configuration example described above, the power supply line 23VDD and the output signal line 23SIG are formed in the first metal layer $58_1$ and the transfer signal lines $22T_1$ to $22T_8$, the selection signal line 22S and the reset signal line 22R are formed in the second metal layer $58_2$, but the present disclosure is not limited to this configuration as long as the wiring layer 55 has a 2-layer structure. In other words, a configuration in which the power supply line 23VDD and the output signal line 23SIG are formed in the second metal layer $58_2$, and the transfer signal lines $22T_1$ to $22T_8$, the selection signal line 22S and the reset signal line 22R are formed in the first metal layer $58_1$ may be adopted.

Further, when a pixel size is sufficiently great and optical adverse effects of the wirings do not need to be considered, the configuration of the solid-state image sensor in the present technology may be adopted in a surface irradiation type CMOS type solid-state image sensor.

Further, the image sensor 11 as described above, for example, can be applied to various electronic devices, such as an imaging system such as a digital still camera or a digital video camera, a mobile phone having an imaging function, or other devices having an imaging function.

Figure 11:
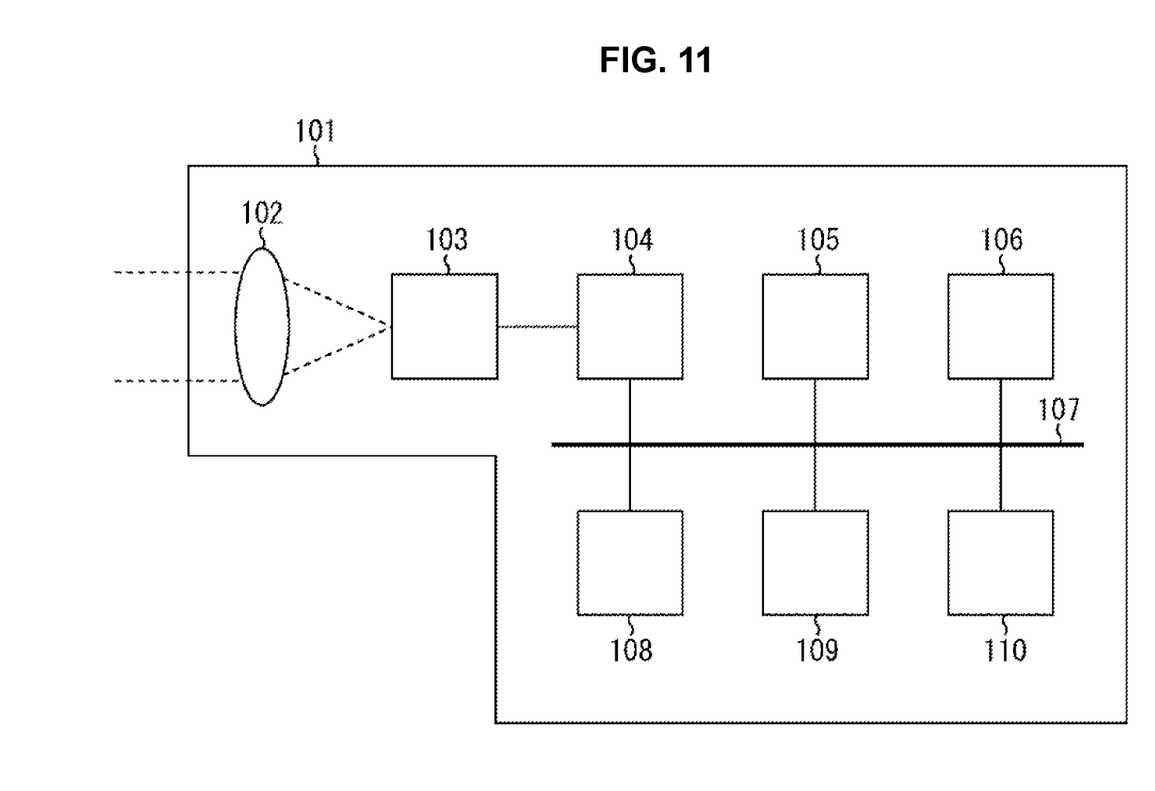
FIG. 11 is a block diagram illustrating a configuration example of an imaging device mounted on an electronic device.

FIG. 11 is a block diagram illustrating a configuration example of an imaging device mounted on an electronic device.

As illustrated in FIG. 11, an imaging device 101 includes an optical system 102, an image sensor 103, and a DSP (Digital Signal Processor) 104, and is configured in such a manner that the DSP 104, a display unit 105, a manipulation system 106, a memory 108, a recording device 109 and a power supply system 110 are connected via a bus 107 such that a still image and a moving image can be captured.

The optical system 102 includes one or a plurality of lenses, and guides image light (incident light) from a subject to the image sensor 103, such that an image is formed on a light receiving surface (sensor unit) of the image sensor 103.

The image sensor 11 in any configuration example described above is applied as the image sensor 103. Electrons are accumulated in the image sensor 103 for a certain period of time according to the image formed on the light receiving surface through the optical system 102. Also, a signal corresponding to the electrons accumulated in the image sensor 104 is supplied to the DSP 104.

The DSP 104 performs various signal processing on the signal from the image sensor 103 to acquire an image and temporarily stores data of the image in the memory 108. The data of the image stored in the memory 108 is recorded in the recording device 109 or supplied to the display unit 105 so that the image is displayed. Further, the manipulation system 106 receives various manipulations by a user and supplies a manipulation signal to each block of the imaging device 101, and the power supply system 110 supplies power necessary for driving of each block of the imaging device 101.

In the imaging device 101 configured in this way, it is possible to more effectively perform reduction of the number of metal layers 58 and decrease a cost by applying the image sensor 11 as described above as the image sensor 103.

Additionally, the present technology may also be configured as below.

(1)

A solid-state image sensor including:

a semiconductor substrate in which a plurality of pixels are arranged; and a wiring layer stacked on the semiconductor substrate and formed in such a manner that a plurality of conductor layers having a plurality of wirings are buried in an insulation film, wherein, in the wiring layer, wirings connected to the pixels are formed of two conductor layers.

(2)

The solid-state image sensor according to (1), wherein a wiring which supplies power necessary for driving of the pixels is disposed in the conductor layer on a side near the semiconductor substrate among the two conductor layers, and a wiring which supplies a driving signal for driving the pixels is disposed in the conductor layer on a side away from the semiconductor substrate.

(3)

The solid-state image sensor according to any one of (1) and (2), wherein a wiring which supplementarily supplies power necessary for driving of the pixels is further disposed in the conductor layer in which the wiring which supplies a driving signal for driving the pixels is disposed.

(4)

The solid-state image sensor according to any one of (1) to (3), further including:

a signal processing substrate in which a logic circuit for driving the pixels is formed, wherein a sensor substrate including the semiconductor substrate and the wiring layer, and the signal processing substrate are stacked.

(5)

The solid-state image sensor according to any one of (1) to (3), wherein the pixels are arranged in the semiconductor substrate in a share unit in which a predetermined number of photoelectric conversion elements share a driving element which performs driving according to the driving signal.

(6)

The solid-state image sensor according to (5), wherein the pixels are arranged in the semiconductor substrate in a share unit in which an arrangement of the photoelectric conversion elements is configured in such a manner that a plurality of sets each including four photoelectric conversion elements, two in a vertical direction and two in a horizontal direction, are continuously arranged.

(7)

The solid-state image sensor according to (5), wherein the pixels are arranged in the semiconductor substrate in a share unit in which an arrangement of the photoelectric conversion elements includes four photoelectric conversion elements, two in a vertical direction and two in a horizontal direction, and an electrode of a driving element which transfers electric charges generated in the photoelectric conversion element is shared between the adjacent share units.

(8)

The solid-state image sensor according to (5), wherein the pixels are arranged in the semiconductor substrate in a share unit in which an arrangement of the photoelectric conversion elements includes four photoelectric conversion elements, one in a vertical direction and four in a horizontal direction, or two photoelectric conversion elements, one in a vertical direction and two in a horizontal direction.

(9)

The solid-state image sensor according to any one of (1) to (8), wherein a conductor layer not connected to the outside is formed in the wiring layer in addition to the two conductor layers.

(10)

The solid-state image sensor according to any one of (1) to (9), that has a structure in which a back side directed to a side opposite to a front surface on which the wiring layer is stacked on the semiconductor substrate is irradiated with light incident on the pixels.

Further, the present embodiment is not limited to the embodiment described above and various changes can be made without departing from the gist of the present disclosure.

REFERENCE SIGNS LIST 11 image sensor, 12 pixel array unit, 13 vertical driving unit, 14 column processing unit, 15 horizontal driving unit, 16 output unit, 17 driving control unit, 21 pixel, 22 horizontal wiring, 23 vertical wiring, 31 PD, 32 transfer transistor, 33 FD, 34 amplification transistor, 35 reset transistor, 41 2-pixel share unit, 42 4-pixel share unit, 43 and 44 8-pixel share unit, 45 and 46 4-pixel share unit, 47 2-pixel share unit, 51 sensor chip, 52 signal processing chip, 53 adhesive layer, 54 semiconductor substrate, 55 wiring layer, 56 silicon layer, 57 interlayer insulation film, 58 metal layer, 61 transfer gate electrode, 62 amplification gate electrode, 63 selection gate electrode, 64 reset gate electrode

The invention claimed is:

1. An electronic device including a solid-state image sensor, the solid state image sensor comprising:

a semiconductor substrate having oppositely facing first and second sides, the first side being a light incident side;

first and second photodiodes in the semiconductor substrate;

a plurality of transistors at the second side of the semiconductor substrate, the plurality of transistors including a transfer transistor, a reset transistor, a select transistor and an amplification transistor;

a wiring layer adjacent the second side of the semiconductor substrate;

a transfer line connected to a gate terminal of the transfer transistor;

a reset line connected to a gate terminal of the reset transistor;
a select line connected to a gate terminal of the select transistor;
a signal line connected to a first terminal of the amplification transistor;
wherein,
the transfer line, the reset line and the select line extend in a horizontal direction in a first layer of the wiring layer;
the signal line extends in a vertical direction in a second layer of the wiring layer, and
the reset transistor, the select transistor and the amplification transistor are shared by the first and second photodiodes.

2. An imaging device comprising:
a semiconductor substrate having oppositely facing first and second sides, the first side being a light incident side;
first and second photodiodes in the semiconductor substrate;
a plurality of transistors at the second side of the semiconductor substrate, the plurality of transistors including a transfer transistor, a reset transistor, a select transistor and an amplification transistor;
a wiring layer adjacent the second side of the semiconductor substrate;
a transfer line connected to a gate terminal of the transfer transistor;
a reset line connected to a gate terminal of the reset transistor;
a select line connected to a gate terminal of the select transistor;
a signal line connected to a first terminal of the amplification transistor;
wherein,
the transfer line, the reset line and the select line extend in a horizontal direction in a first layer of the wiring layer;
the signal line extends in a vertical direction in a second layer of the wiring layer, and
the reset transistor, the select transistor and the amplification transistor are shared by the first and second photodiodes.

3. The imaging device of claim 2, wherein a wiring which supplies power necessary for driving of the pixels is disposed in the conductor layer on a side near the semiconductor substrate among the two conductor layers, and a wiring which supplies a driving signal for driving the pixels is disposed in the conductor layer on a side away from the semiconductor substrate.

4. The imaging device of claim 3, wherein a wiring which supplementarily supplies power necessary for driving of the pixels is further disposed in the conductor layer in which the wiring which supplies a driving signal for driving the pixels is disposed.

5. The imaging device of claim 2, further comprising a signal processing substrate in which a logic circuit for driving the pixels is formed, wherein a sensor substrate including the semiconductor substrate and the wiring layer, and the signal processing substrate are stacked.

6. The imaging device of claim 2, wherein the pixels are arranged in the semiconductor substrate in a share unit in which a predetermined number of photoelectric conversion elements share a driving element which performs driving according to the driving signal.

7. The imaging device of claim 6, wherein the pixels are arranged in the semiconductor substrate in a share unit in which an arrangement of the photoelectric conversion elements is configured in such a manner that a plurality of sets each including four photoelectric conversion elements, two in a vertical direction and two in a horizontal direction, are continuously arranged.

8. The imaging device of claim 6, wherein the pixels are arranged in the semiconductor substrate in a share unit in which an arrangement of the photoelectric conversion elements includes four photoelectric conversion elements, two in a vertical direction and two in a horizontal direction, and an electrode of a driving element which transfers electric charges generated in the photoelectric conversion element is shared between the adjacent share units.

9. The imaging device of claim 6, wherein the pixels are arranged in the semiconductor substrate in a share unit in which an arrangement of the photoelectric conversion elements includes four photoelectric conversion elements, one in a vertical direction and four in a horizontal direction, or two photoelectric conversion elements, one in a vertical direction and two in a horizontal direction.

10. The imaging device of claim 2, wherein a conductor layer not connected to the outside is formed in the wiring layer in addition to the two conductor layers.

11. The imaging device of claim 2, that has a structure in which a back side directed to a side opposite to a front surface on which the wiring layer is stacked on the semiconductor substrate is irradiated with light incident on the pixels.

* * * * *